United States Patent [19]
Sone

[11] Patent Number: 5,510,734
[45] Date of Patent: Apr. 23, 1996

[54] HIGH SPEED COMPARATOR HAVING TWO DIFFERENTIAL AMPLIFIER STAGES AND LATCH STAGE

[75] Inventor: Kazuya Sone, Tokyo, Japan

[73] Assignee: NEC Corporation, Tokyo, Japan

[21] Appl. No.: 490,174

[22] Filed: Jun. 14, 1995

[30] Foreign Application Priority Data

Jun. 14, 1994 [JP] Japan ................................. 6-131730

[51] Int. Cl.⁶ .......................... H03K 5/22; H03K 3/289
[52] U.S. Cl. ................. 324/65; 327/91; 327/203
[58] Field of Search ........................ 327/63–67, 77–79, 327/55, 87, 89, 91, 95, 96, 97, 202, 203, 204, 199, 214, 223

[56] References Cited

U.S. PATENT DOCUMENTS

| | | | |
|---|---|---|---|
| 4,823,028 | 4/1989 | Lloyd | 327/64 |
| 5,001,361 | 3/1991 | Tamamura et al. | 327/202 |
| 5,196,742 | 3/1993 | McDonald | 327/65 |
| 5,287,016 | 2/1994 | Dansky et al. | 327/202 |
| 5,347,175 | 9/1994 | Lang et al. | 327/77 |

FOREIGN PATENT DOCUMENTS

| | | | |
|---|---|---|---|
| 402036610 | 2/1990 | Japan | 327/202 |
| 402292910 | 12/1990 | Japan | 327/203 |

OTHER PUBLICATIONS

M. Hotta et al., "A 150–mW 8–Bit Video–Frequency A/D Converter", IEEE Journal of Solid–State Circuits, vol. SC–21, No. 2, pp. 318–323, Apr. 26, 1986.
T. Wakimoto et al., "Si Bipolar 2–GHz 6–Bit Flash A/D Conversion LSI", IEEE Journal of Solid–State Circuits, vol. 23, No. 6, pp.1345–1350, Dec. 1988.

Primary Examiner—Toan Tran
Attorney, Agent, or Firm—Foley & Lardner

[57] ABSTRACT

In a comparator including a first differential amplifier stage for amplifying the difference in potential between input signals, a second differential amplifier stage for amplifying the difference in potential between output signals of the first differential amplifier stage, and a latch stage for positively feeding output signals of the second amplifier stage back thereto, a first differential switch circuit alternately activates the second differential amplifier stage and the latch stage, and a second differential switch circuit alternately activates the first differential amplifier stage and the latch stage.

18 Claims, 17 Drawing Sheets

HIGH SPEED COMPARATOR HAVING TWO DIFFERENTIAL AMPLIFIER STAGES AND LATCH STAGE

BACKGROUND OF THE INVENTION

1. Field of the Invention

The present invention relates to a comparator having two differential amplifiers and a latch circuit, which can be applied to an analog/digital (A/D) converter.

2. Description of the Related Art

Conventionally, a comparator includes a differential amplifier and a latch circuit for latching the outputs of the differential amplifier, which, however, requires a high power consumption.

In order to reduce the power consumption, a first prior art comparator includes a prestage differential amplifier in front of the conventional comparator (see: M. Hotta et al., "A 150-mV 8-Bit Video-Freguency A/D Converter", IEEE Journal of Solid-State Circuits, vol. SC-21, No. 2, pp. 318–323, April 1986). This will be explained later in detail.

In the first prior art comparator, however, the operation speed of the latch stage cannot be increased, and therefore, the operation speed of the comparator cannot be increased.

In order to increase the operation speed, a second prior art comparator includes emitter-follower type buffers connected to the latch stage (see: T. Wakimoto et al., "Si Bipolar 2-GHz 6-bit Flash A/D Conversion LSI", IEEE Journal of Solid-State Circuits, vol. 23, No. 6, December 1988). This will be explained later in detail.

In the second prior art comparator, however, the operation speed of the latch stage is still low, and therefore, the operation speed of the comparator is still low.

SUMMARY OF THE INVENTION

It is an object of the present invention to provide a high speed comparator having two differential amplifier stages and a latch stage.

According to the present invention, in a comparator including a first differential amplifier stage for amplifying the difference in potential between input signals, a second differential amplifier stage for amplifying the difference in potential between output signals of the first differential amplifier stage, and a latch stage for positively feeding output signals of the second amplifier stage back thereto, a first differential switch circuit alternately switches the second differential amplifier stage and the latch stage, and a second differential switch circuit alternately switches the first differential amplifier stage and the latch stage. Thus, when the latch stage is activated, the two differential amplifiers can be deactivated. As a result, the operation speed of the latch stage can be increased, and therefore, the operation speed of the comparator can be increased.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art comparators will be explained with reference to FIGS. 1 and 2.

Figure 1:
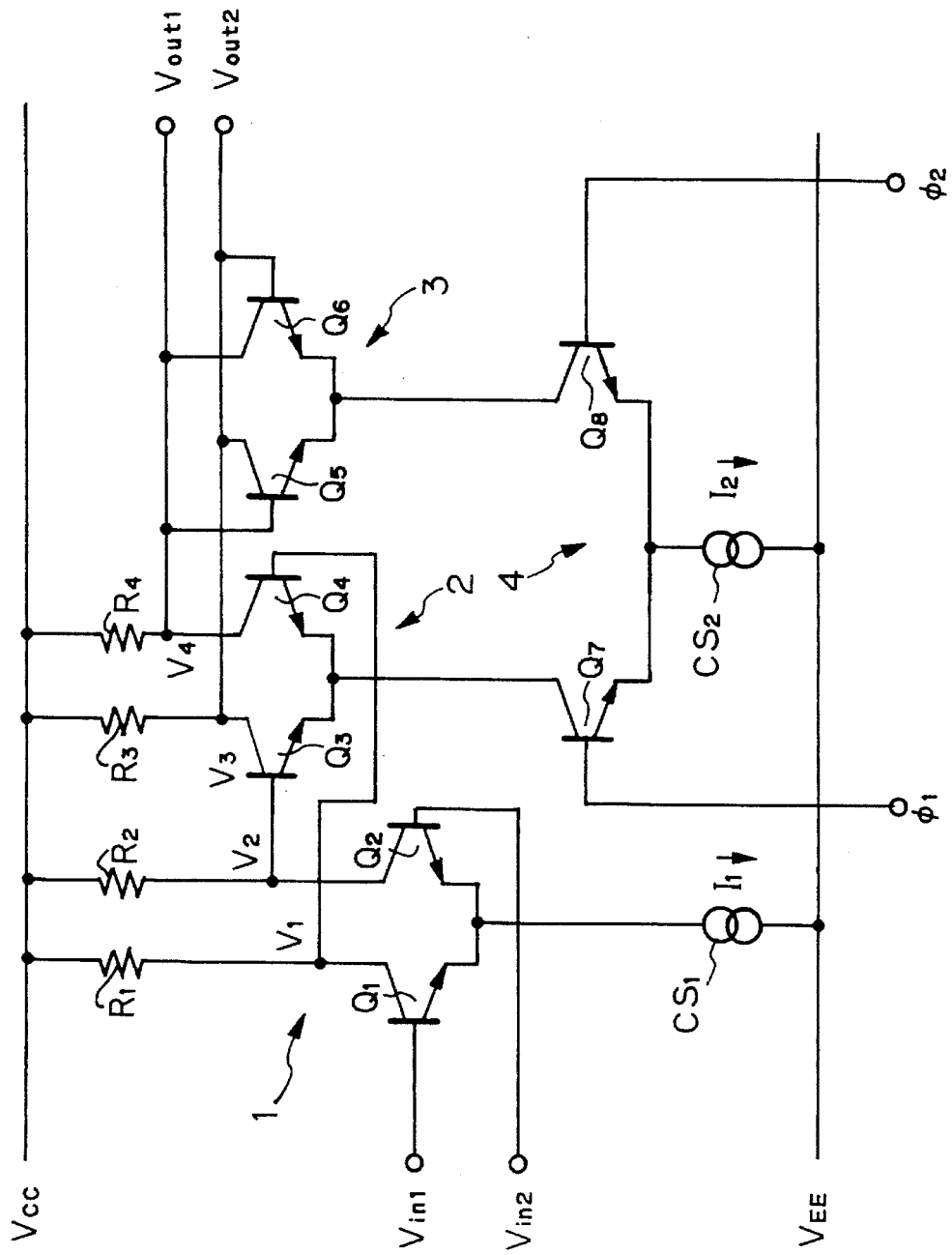
FIG. 1 is a circuit diagram illustrating a first prior art comparator.
Figure 2:
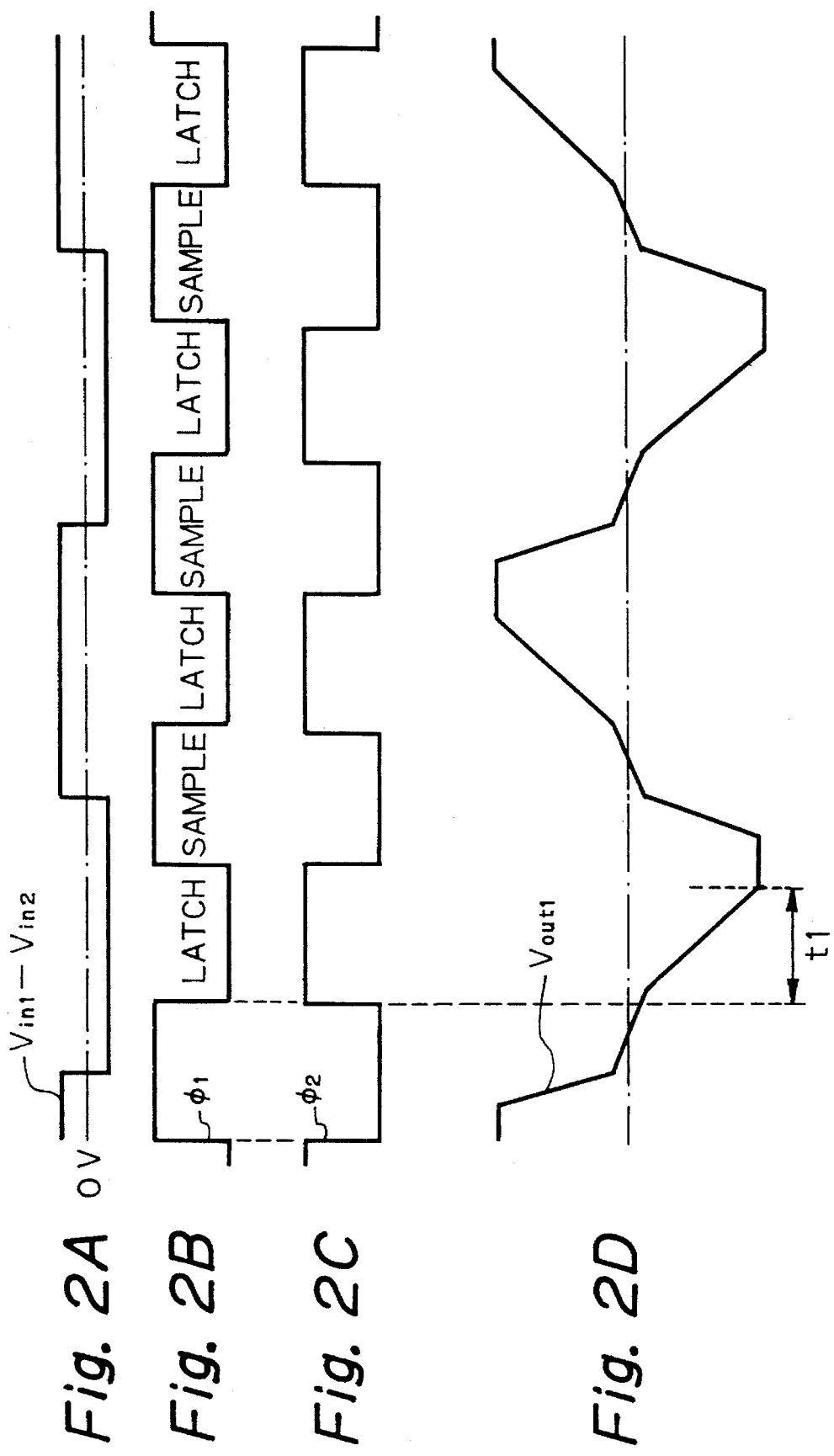
FIGS. 2A through 2D are timing diagrams for explaining the operation of the comparator of FIG. 1.

In FIG. 1 which illustrates a first prior art comparator (see: the M. Hotta document), reference numeral 1 designates a first differential amplifier stage formed by two resistors $R_1$ and $R_2$ connected to a high power supply $V_{cc}$ and transistors $Q_1$ and $Q_2$ having collectors connected to the resistors $R_1$ and $R_2$, respectively. Also, emitters of the transistors $Q_1$ and $Q_2$ are connected commonly to a constant current source $CS_1$ having a current $I_1$ flowing therethrough, which source is connected to a low power supply $V_{EE}$. Further, input signals $V_{in^1}$ and $V_{in^2}$ are supplied to bases of the transistors $Q_1$ and $Q_2$, respectively. Thus, the first differential amplifier stage 1 with the constant current source $CS_1$ always amplifies the difference in potential between the input signals $V_{in^1}$ and $V_{in^2}$ to generate differential output signals $V_1$ and $V_2$.

Also, in FIG. 1, a second differential amplifier stage 2 is formed by resistors $R_3$ and $R_4$ connected to the high power supply $V_{cc}$, and transistors $Q_3$ and $Q_4$ having collectors connected to the resistors $R_3$ and $R_4$, respectively. Also, emitters of the transistors $Q_3$ and $Q_4$ are connected via a transistor $Q_7$ to a constant current source $CS_2$ having a current $I_2$ flowing therethrough, which source is connected to the low power supply $V_{EE}$. Further, the differential output signals $V_1$ and $V_2$ of the first differential amplifier stage 1 are supplied to the bases of the trasistors $Q_3$ and $Q_4$, respectively. Thus, when the transistor $Q_7$ is turned ON, the second differential amplifier stage 2 with the constant current source $CS_2$ amplifies the difference in potential between the signals $V_1$ and $V_2$ to generate differential output signals $V_3$ and $V_4$.

Further, in FIG. 1, a latch stage 3 is formed by the resistors $R_3$ and $R_4$, and transistors $Q_5$ and $Q_6$ having collectors connected to the resistors $R_3$ and $R_4$, respectively. Also, emitters of the transistors $Q_5$ and $Q_6$ are connected via a transistor $Q_8$ to the constant current source $CS_2$. Further, the differential output signals $V_3$ and $V_4$ of the first differential amplifier stage 2 are supplied to the bases of the transistors $Q_3$ and $Q_4$, respectively, and to the collectors of the transistors $Q_4$ and $Q_3$, respectively. Thus, when the transistor $Q_8$ is turned ON, the latch stage 3 with the constant current source $CS_2$ amplifies the difference in potential between the signals $V_3$ and $V_4$ and feeds it back to the second differential amplifier 2. As a result, the output signals $V_4$ and $V_3$ are latched by the activated latch stage 3, and output as output signals $V_{out}^1$ and $V_{out}^2$, respectively, of the comparator of FIG. 1.

The bases of the transistors $Q_7$ and $Q_8$ are controlled by complementary control signals $\phi_1$ and $\phi_2$ opposite in phase to each other. Since the transistors $Q_7$ and $Q_8$ with the constant current source $CS_2$ activate only one of the second differential stage 2 and the latch stage 3, the transistors $Q_7$ and $Q_8$ and the constant current source $CS_2$ form a differential switch circuit 4.

The operation of the comparator of FIG. 1 is shown in FIGS. 2A, 2B, 2C and 2D.

Assume that the difference in potential between the input signals $V_{in}^1$ and $V_{in}^2$ is changed as shown in FIG. 2A, and the control signals $\phi_1$ and $\phi_2$ are changed as shown in FIGS. 2B and 2C.

When the control signals $\phi_1$ and $\phi_2$ are high and low, respectively, the transistors $Q_7$ and $Q_8$ are turned ON and OFF, respectively, so that the second differential stage 2 is activated by the constant current source $CS_1$ and the latch stage 3 is deactivated. Therefore, the control is in a sampling mode, i.e., in a comparison mode. As a result, as shown in FIG. 2D, the differential output signals $V_1$ and $V_2$ of the first differential amplifier stage 1 are amplified by the second differential amplifier stage 2.

Next, when the control signals $\phi_1$ and $\phi_2$ are low and high, respectively, the transistors $Q_7$ and $Q_8$ are turned OFF and ON, respectively, so that the latch stage 3 is activated by the constant current source $CS_2$ and the second differential amplifier stage 2 is deactivated. Therefore, the control is in a latch mode. As a result, as shown in FIG. 2D, the output signal $V_{out}^1$ is determined whether or not the difference $(V_{in}^1-V_{in}^2)$ is positive.

In order to reduce the power consumption, the current $I_2$ of the constant current source $CS_2$ is preferably as small as possible. In this case, a time t1 required for the determination of the output signal $V_{out}^1$ is so large that the frequency of the control signals $\phi_1$ and $\phi_2$ cannot be increased, i.e., the operation speed of the comparator cannot be increased.

Figure 3:
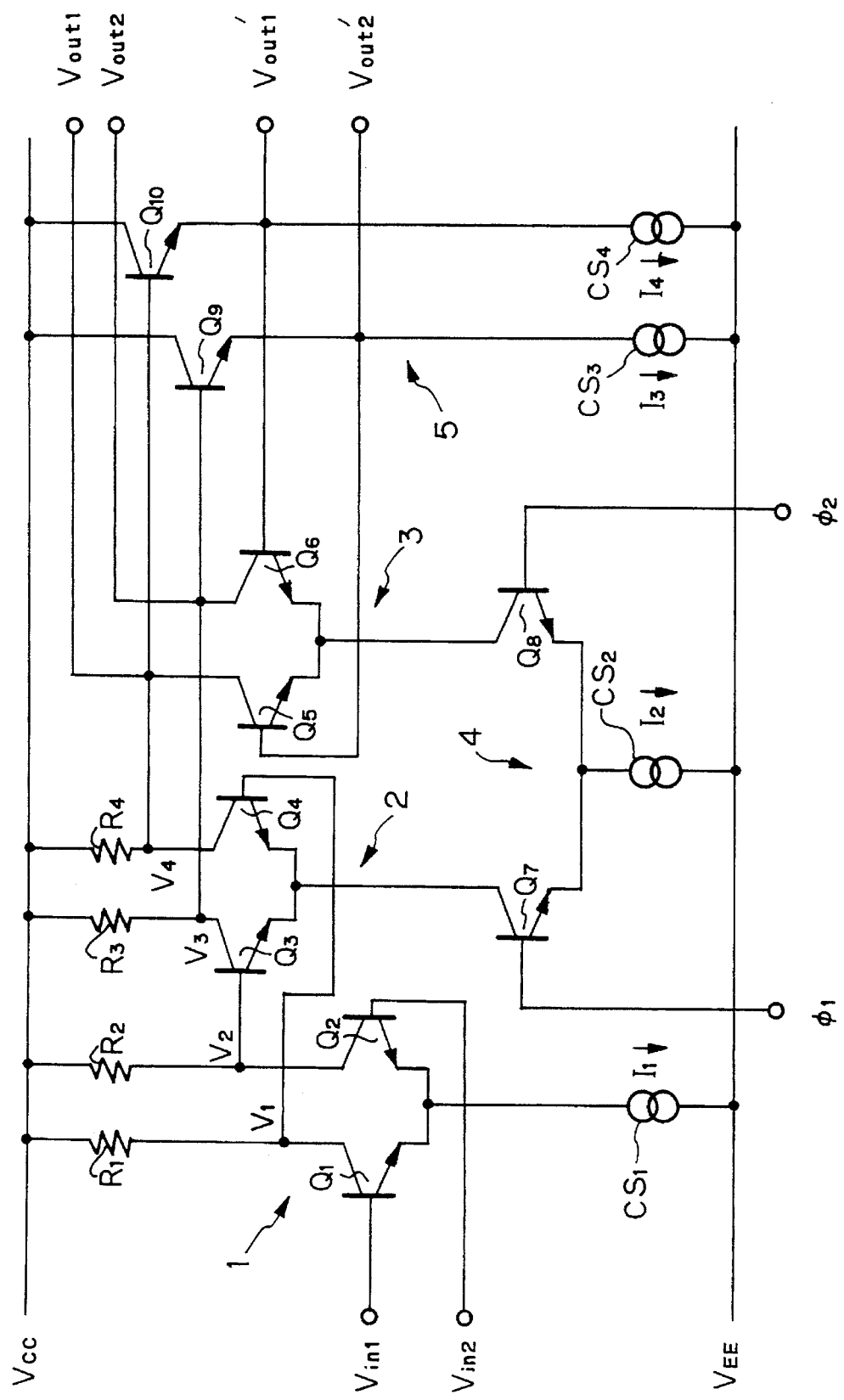
FIG. 3 is a circuit diagram illustrating a second prior art comparator.

In FIG. 3, which illustrates a second prior art comparator (see: the T. Wakimoto document), an emitter-follower type buffer 5 is interposed between the second differential amplifier stage 2 and the latch stage 3. That is, the buffer 5 is formed by an emitter follower $Q_9$, a constant current source $CS_3$ having a current $I_3$ flowing therethrough, an emitter follower $Q_{10}$ and a constant current source $CS_4$ having a current $I_4$ flowing therethrough. In more detail, the emitter follower $Q_9$ has a collector connected to the high power supply $V_{cc}$, a base connected to the resistor $R_3$, and an emitter connected to the constant current source $CS_3$. Similarly, the emitter follower $Q_{10}$ has a collector connected to the high power supply $V_{cc}$, a base connected to the resistor $R_4$, and an emitter connected to the constant current source $CS_4$. As a result, the collector-emitter voltage of each of the transistors $Q_5$ and $Q_6$ is increased by the base-emitter voltage of each of the emitter followers $Q_{10}$ and $Q_9$, respectively. Thus, a time required for a latch operation can be reduced; however, the speed of latch operation is still low. Note that emitter voltages of the emitter followers $Q_9$ and $Q_{10}$ can be used as output signals $V'_{out}^1$ and $V'_{out}^2$.

Figure 4:
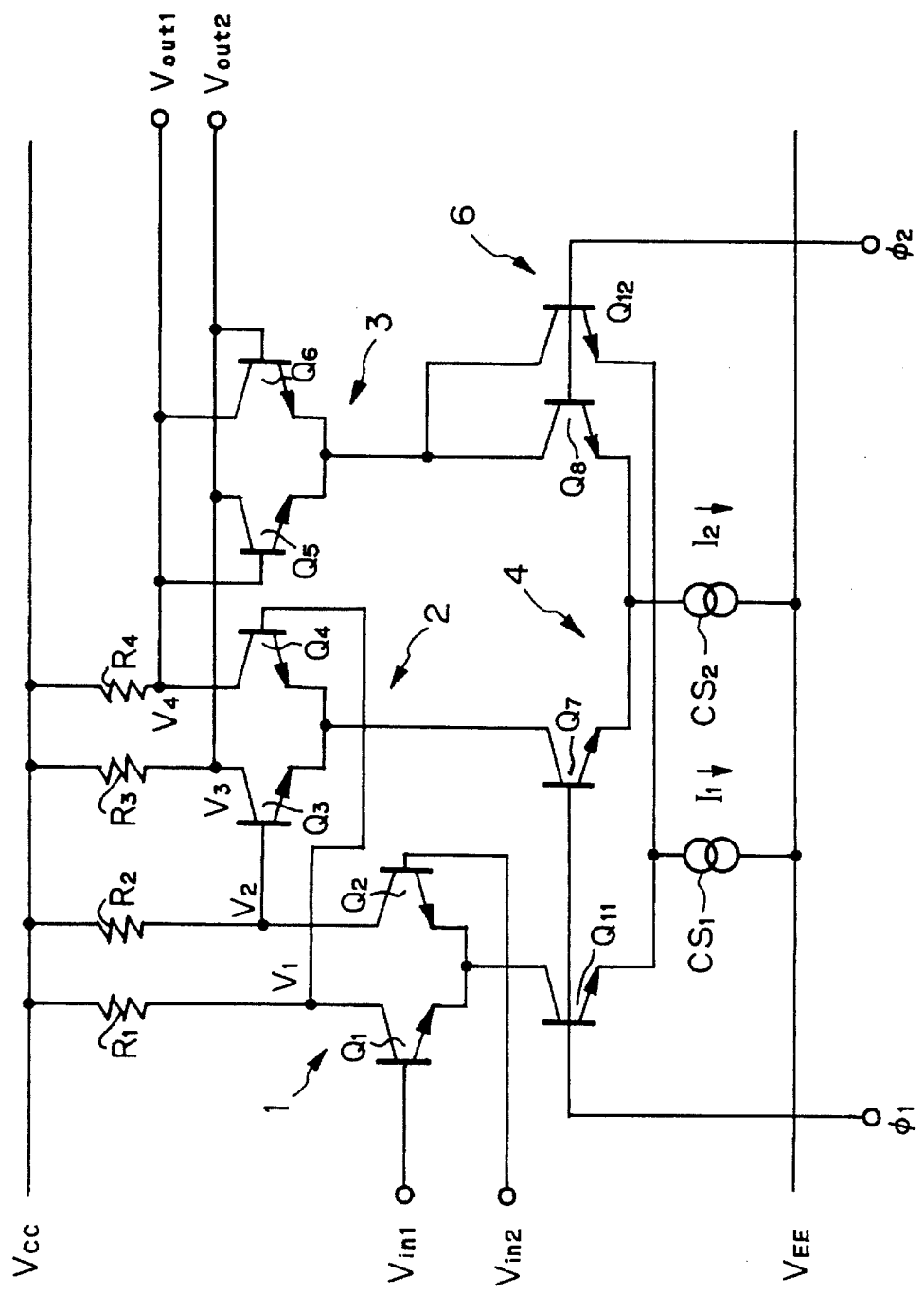
FIG. 4 is a circuit diagram illustrating a first embodiment of the comparator according to the present invention.

In FIG. 4, which illustrates a first embodiment of the present invention transistors $Q_{11}$ and $Q_{12}$ are added to the elements of FIG. 1. That is, the transistor $Q_{11}$, which is controlled by the control signal $\phi_1$, is interposed between the first differential amplifier stage 1 and the constant current source $CS_1$, and the transistor $Q_{12}$, which is controlled by the control signal $\phi_2$, is interposed between the latch stage 3 and the constant current source $CS_1$. Since the transistors $Q_{11}$ and $Q_{12}$ with the constant current source $CS_1$ activate only one of the first differential amplifier stage 1 and the latch stage 3, the transistors $Q_{11}$ and $Q_{12}$ and the constant current source $CS_1$ form a differential switch circuit 6.

The operation of the comparator of FIG. 4 is shown in FIGS. 5A, 5B, 5C and 5D.

Figures 5A, 5B, 5C, 5D:
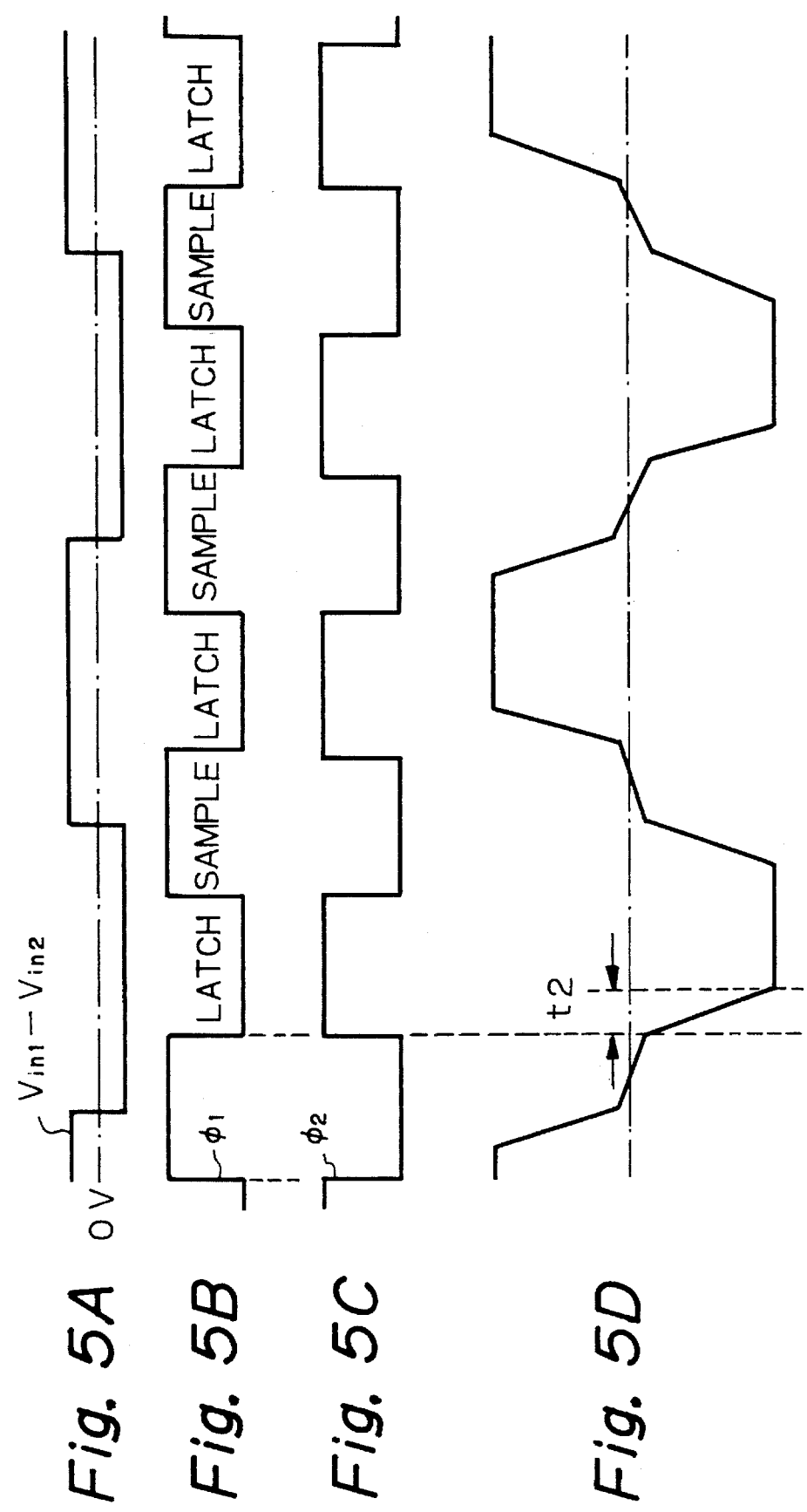
FIGS. 5A through 5D are timing diagrams for explaining the operation of the comparator of FIG. 1.

Also, in this case, assume that the difference in potential between the input signals $V_{in}^1$ and $V_{in}^2$ is changed as shown in FIG. 5A, and the control signals $\phi_1$ and $\phi_2$ are changed as shown in FIGS. 5B and 5C.

When the control signals $\phi_1$ and $\phi_2$ are high and low, respectively, the transistors $Q_7$ and $Q_{11}$ are turned ON and the transistors $Q_8$ and $Q_{12}$ are turned OFF, respectively, so that the second differential stage 2 is activated by the constant current source $CS_1$ and the latch stage 3 is deactivated, in the same way as in the prior art comparator of FIG. 1 (see FIGS. 2A through 2D). Therefore, the control is in a sampling mode, i.e., in a comparison mode. As a result, as shown in FIG. 5D, the differential output signals $V_1$ and $V_2$ of the first differential amplifier stage 1 are amplified by the second differential amplifier stage 2.

Next, when the control signals $\phi_1$ and $\phi_2$ are low and high, respectively, the transistors $Q_7$ and $Q_{11}$ are turned OFF and the transistors $Q_8$ and $Q_{12}$ are turned ON, so that the latch stage 3 is activated by the constant current sources $CS_1$ and $CS_2$, and the differential amplifier stages 1 and 2 are deactivated. Therefore, the control is in a latch mode. As a result, as shown in FIG. 5D, the output signal $V_{out}^1$ is determined whether or not the difference $(V_{in}^1-V_{in}^2)$ is positive.

Thus, in the first embodiment as illustrated in FIG. 4, the latch stage 3 is activated by the two constant current sources $CS_1$ and $CS_2$, in other words, a current flowing through the latch stage 3 is $I_1+I_2$. Therefore, a time t2 required for the determination of the output signal $V_{out}^1$ is $$t2 \approx t1 \cdot I_1/(I_1+I_2)$$

If $I_1=I_2$, then $$t2 \approx t1/2$$

Therefore, since the operation speed of the latch stage 3 can be increased, it is possible to increase the frequency of the control signals $\phi_1$ and $\phi_2$, to increase the operation speed of the comparator of FIG. 4.

Figure 6:
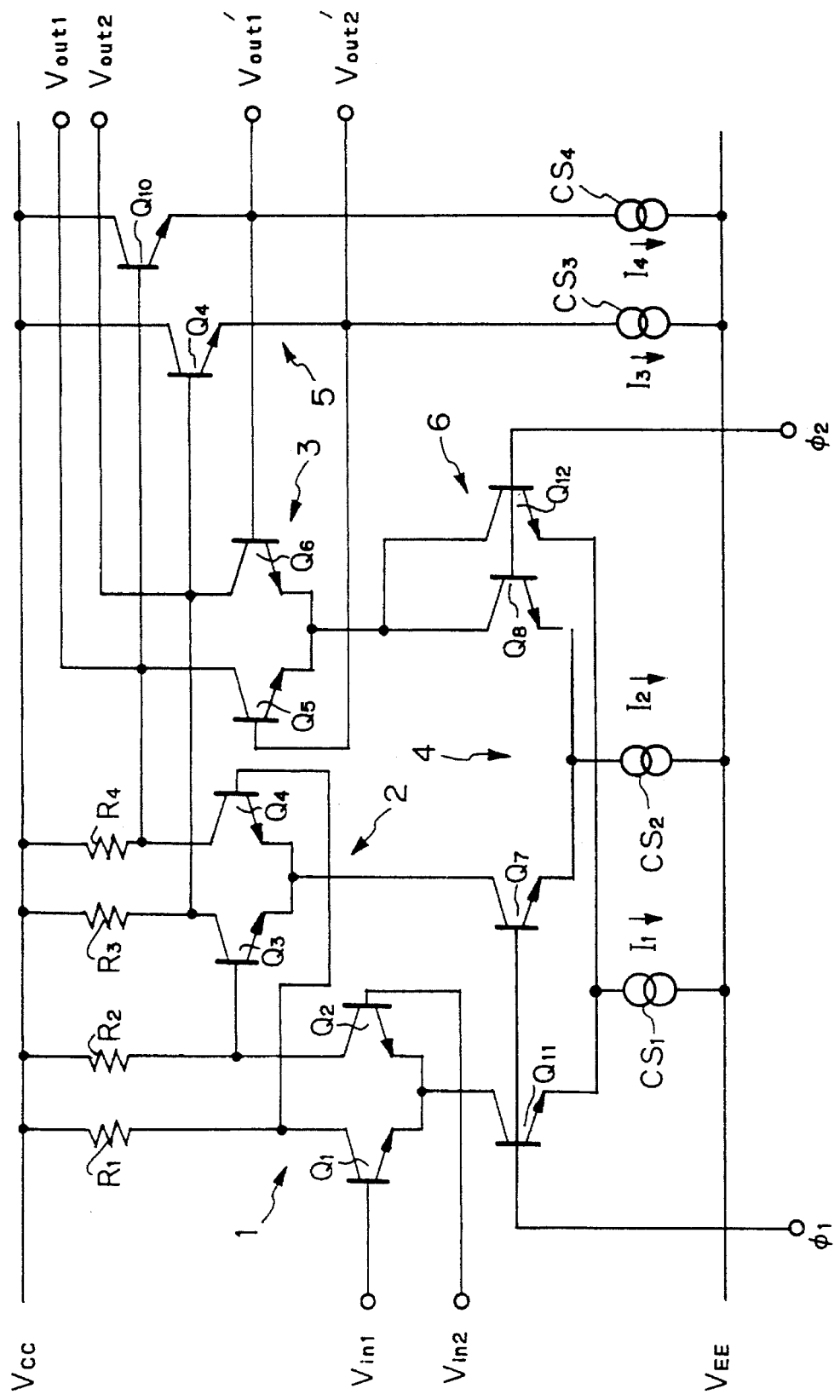
FIG. 6 is a circuit diagram illustrating a second embodiment of the comparator according to the present invention.

In FIG. 6, which illustrates a second embodiment of the present invention, the buffer 5 formed by the emitter followers $Q_9$ and $Q_{10}$ and the constant current sources $IS_3$ and $IS_4$ of FIG. 3 is added to the elements of FIG. 4. As a result, the collector-emitter voltage of each of the transistors $Q_5$ and $Q_8$ is increased by the base-emitter voltage of each of the emitter followers $Q_{10}$ and $Q_9$, respectively. Thus, the time t2 required for a latch operation can be further reduced.

Figure 7:
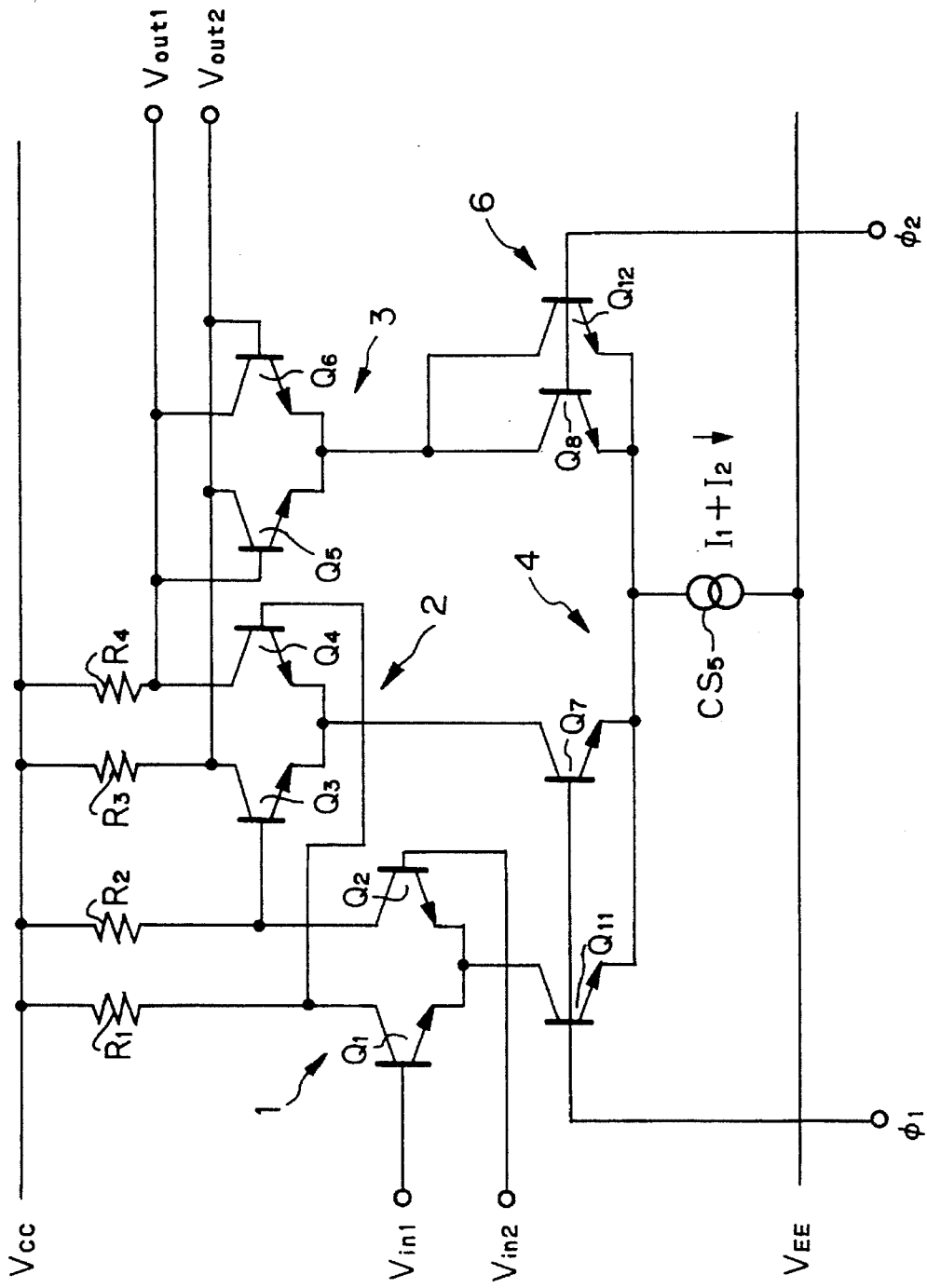
FIG. 7 is a circuit diagram illustrating a third embodiment of the comparator according to the present invention.

In FIG. 7, which illustrates a third embodiment of the present invention, the constant current sources $CS_1$ and $CS_2$ are replaced with a constant current source $CS_5$ having a current $(I_1+I_2)$ flowing therethrough. In this case, the differential switch circuit 4 is formed by the transistors $Q_7$ and $Q_8$ and the constant current source $CS_5$, and the differential switch circuit 6 is formed by the transistors $Q_{11}$ and $Q_{12}$ and the constant current source $CS_5$. Thus, the comparator of FIG. 7 can be reduced in size as compared with the comparator of FIG. 4.

Figure 8:
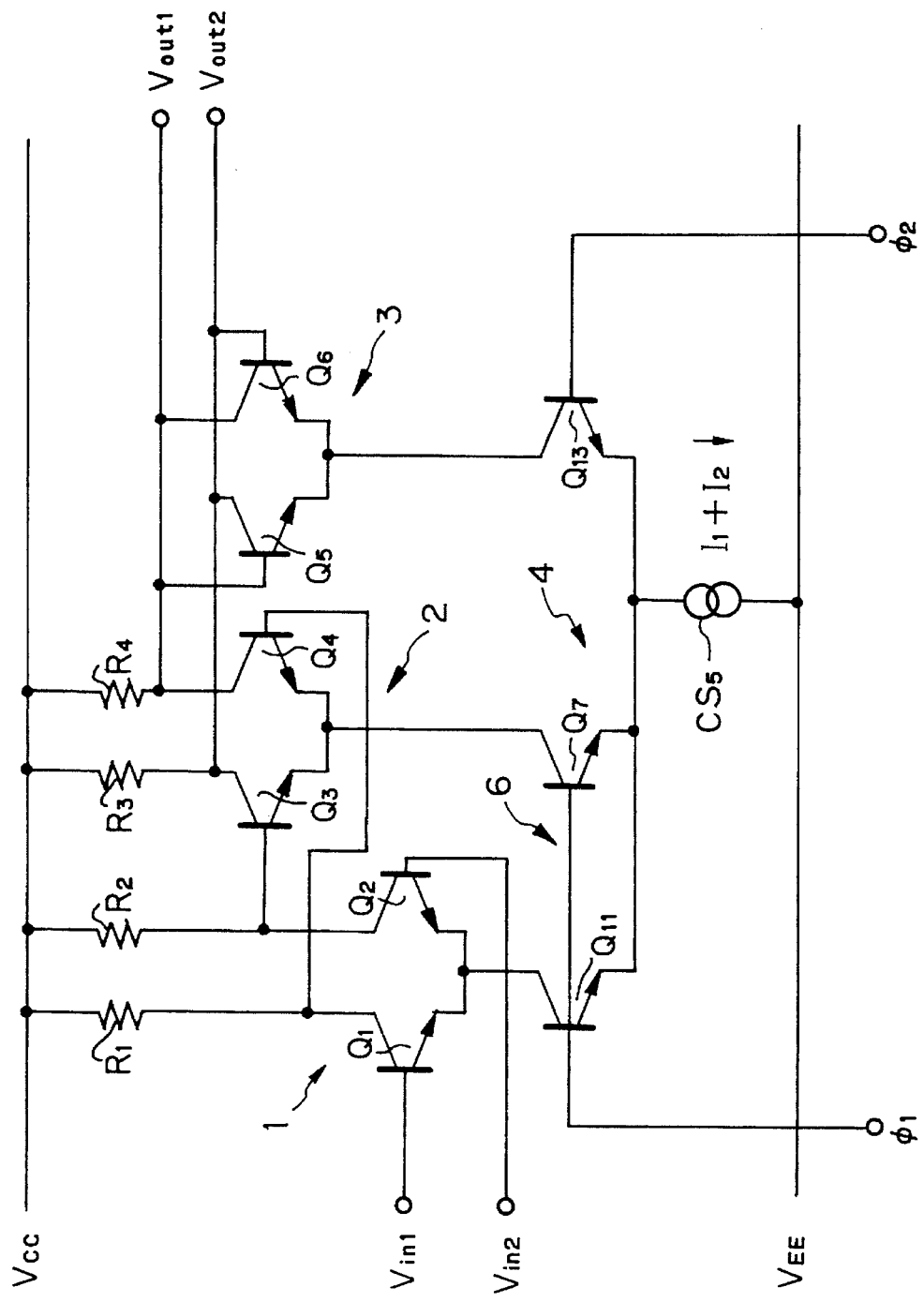
FIG. 8 is a circuit diagram illustrating a fourth embodiment of the comparator according to the present invention.

In FIG. 8, which illustrates a fourth embodiment of the present invention, the transistors $Q_8$ and $Q_{12}$ of FIG. 7 are replaced with a transistor $Q_{13}$. Thus, the comparator of FIG. 8 can be reduced in size as compared with the comparator of FIG. 7.

Figure 9:
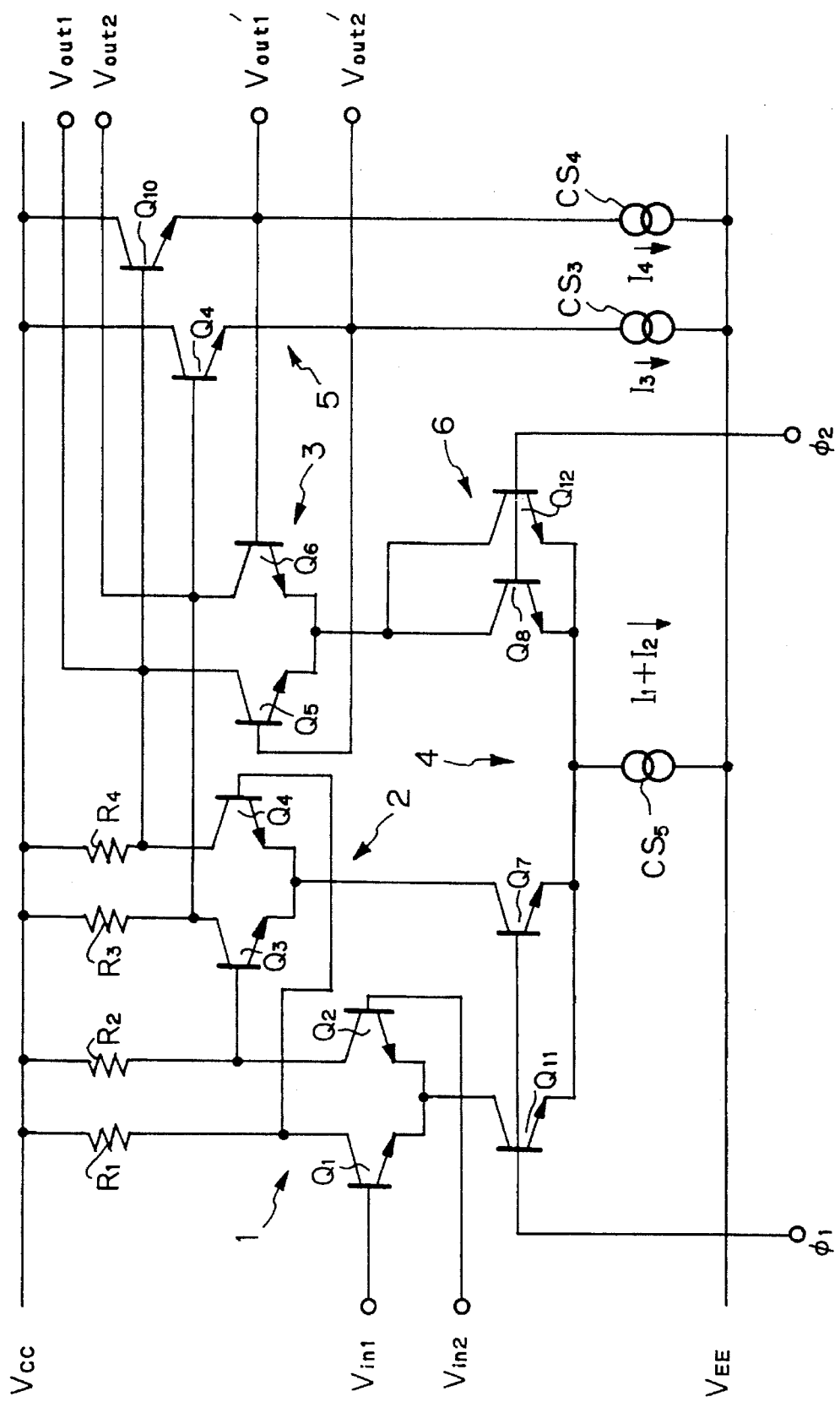
FIG. 9 is a circuit diagram illustrating a fifth embodiment of the comparator according to the present invention.

In FIG. 9, which illustrates a fifth embodiment of the present invention, the comparator of FIG. 6 is combined with that of FIG. 7. Thus, the comparator of FIG. 9 can be reduced in size as compared with the comparator of FIG. 6.

Figure 10:
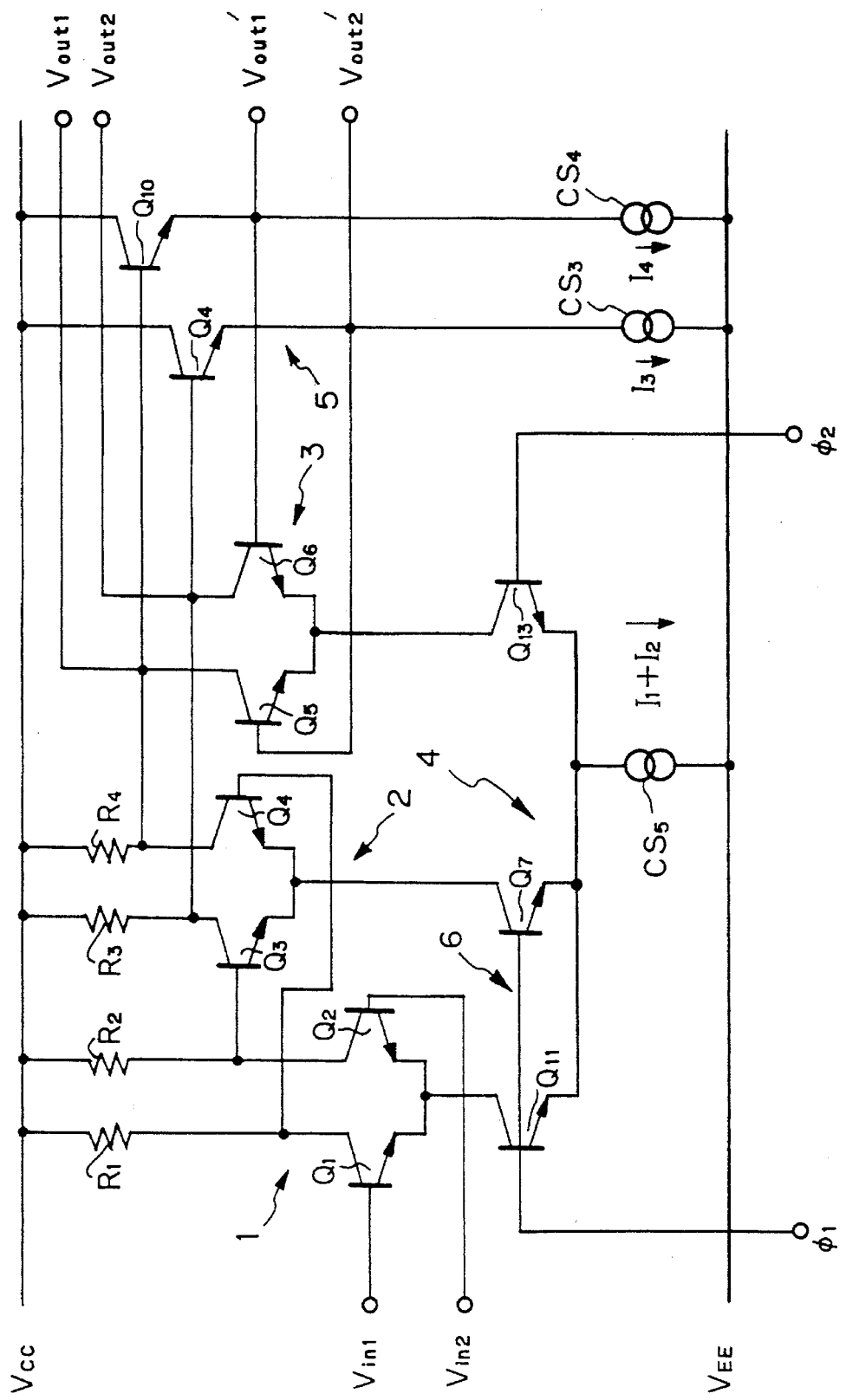
FIG. 10 is a circuit diagram illustrating a sixth embodiment of the comparator according to the present invention.

In FIG. 10, which illustrates a sixth embodiment of the present invention, the comparator of FIG. 6 is combined with that of FIG. 8. Thus, the comparator of FIG. 10 can be reduced in size as compared with the comparator of FIG. 9.

Figure 11:
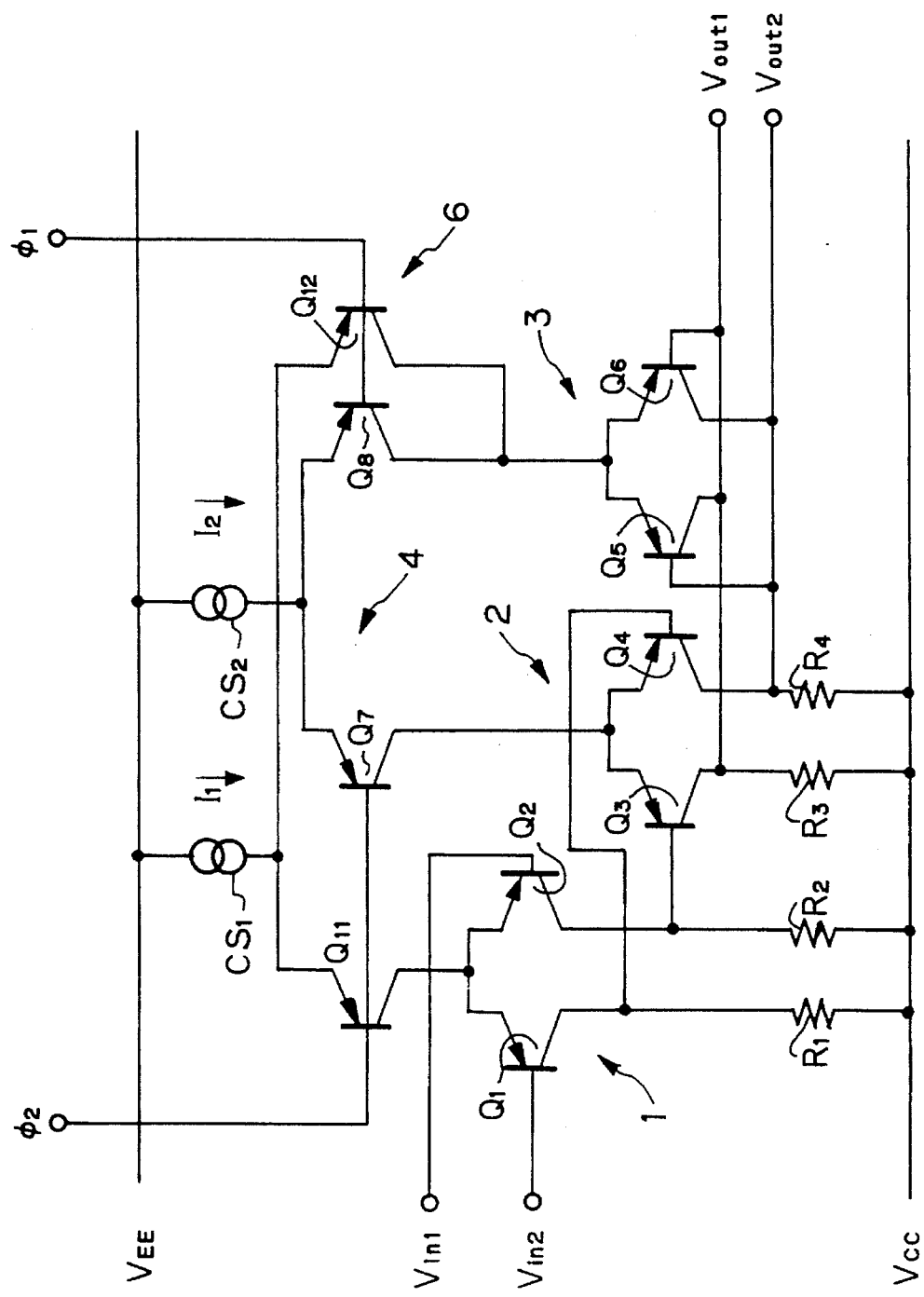
FIG. 11 is a circuit diagram illustrating a modification of the comparator of FIG. 4.
Figure 12:
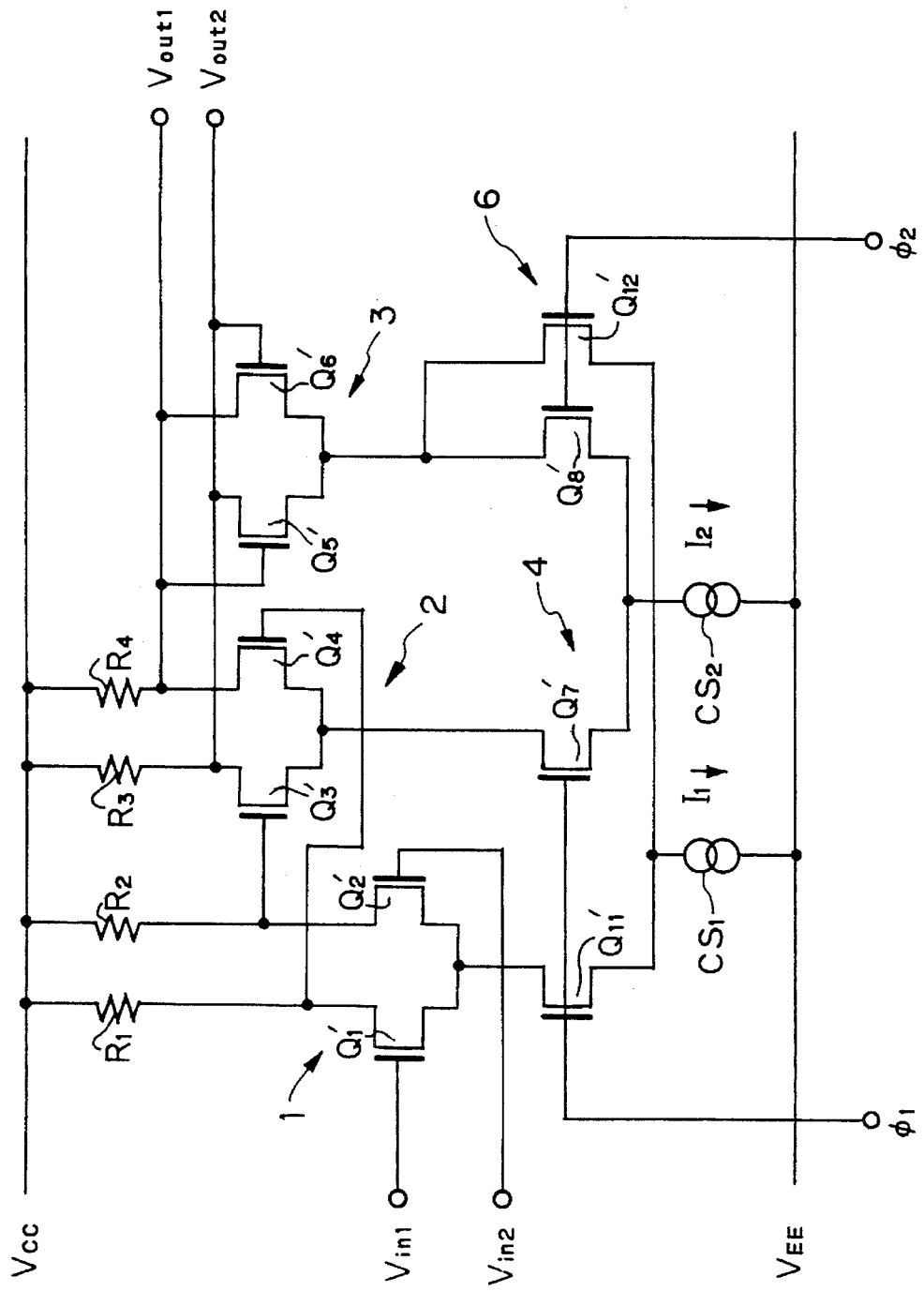
FIG. 12 is a circuit diagram illustrating another modification of the comparator of FIG. 4.
Figure 13:
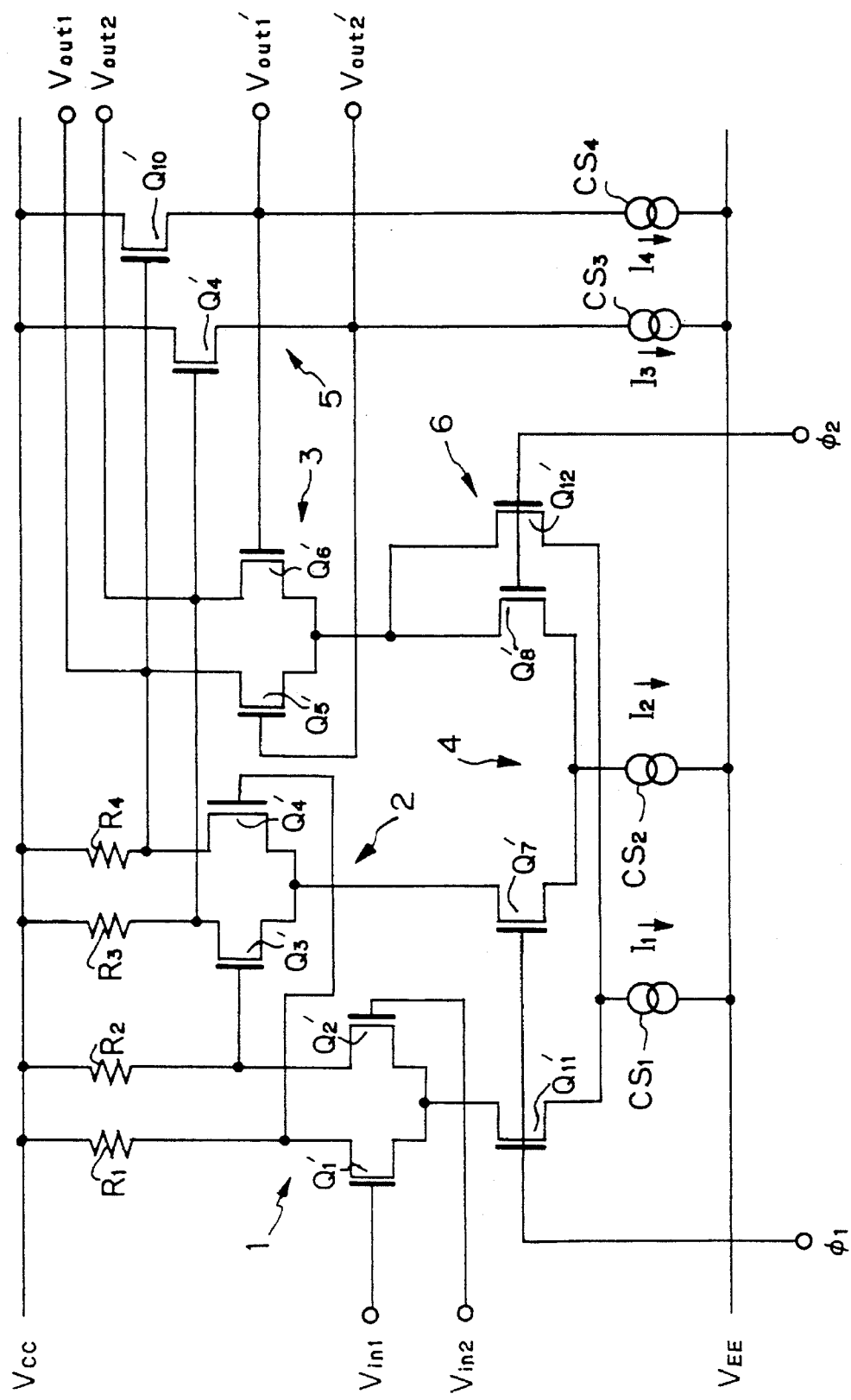
FIG. 13 is a circuit diagram illustrating a modification of the comparator of FIG. 6.
Figure 14:
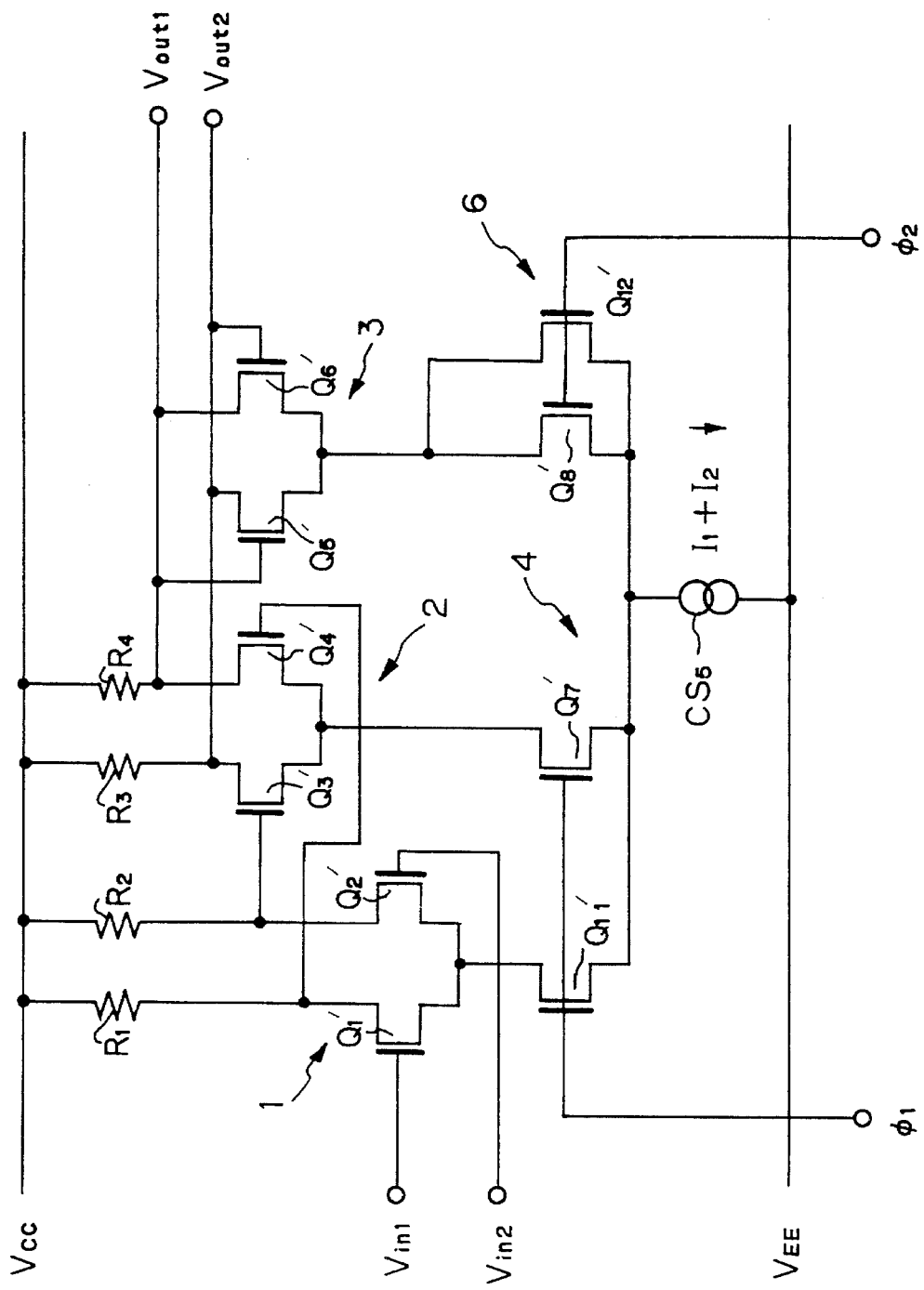
FIG. 14 is a circuit diagram illustrating a modification of the comparator of FIG. 7.
Figure 15:
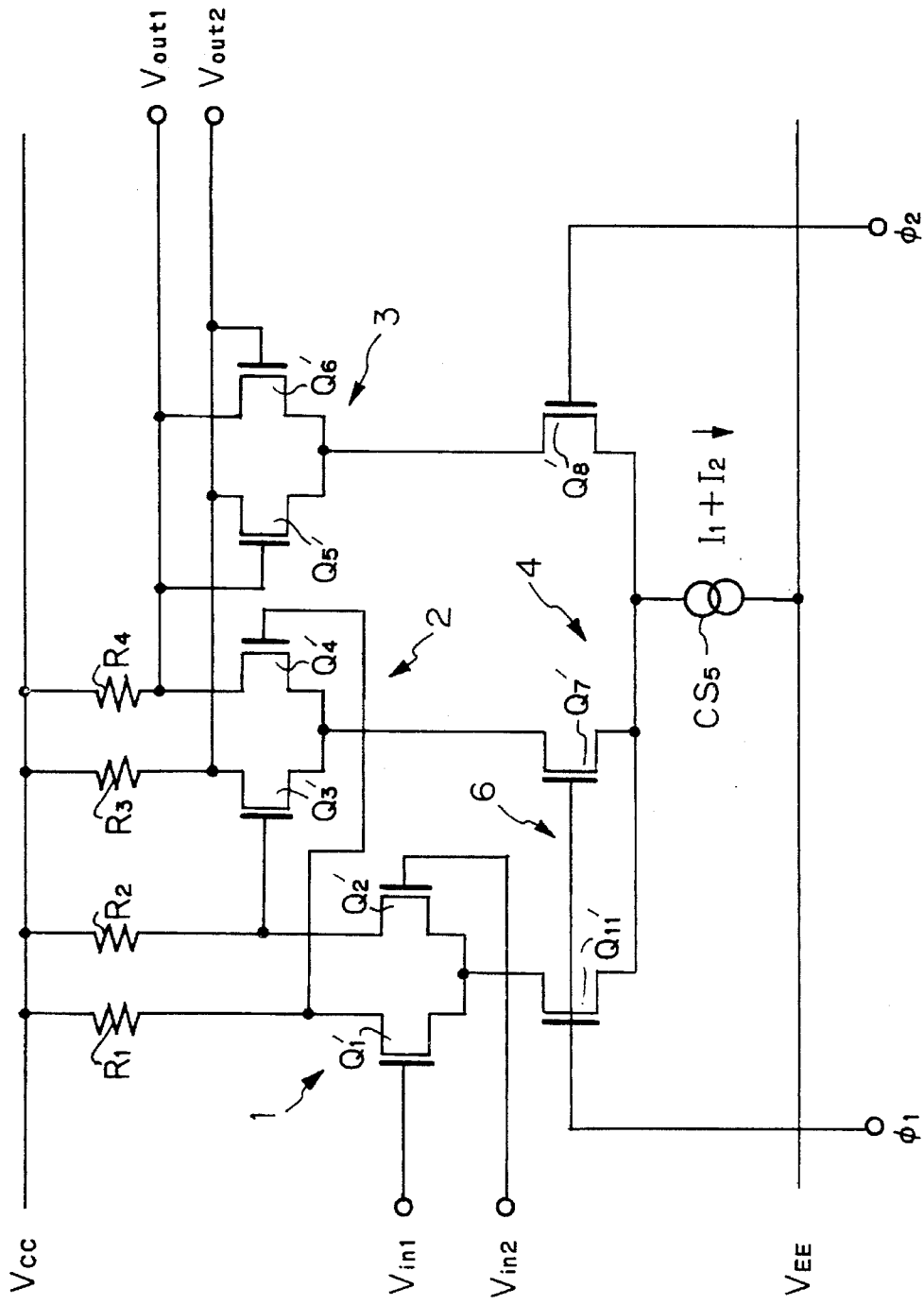
FIG. 15 is a circuit diagram illustrating a modification of the comparator of FIG. 8.
Figure 16:
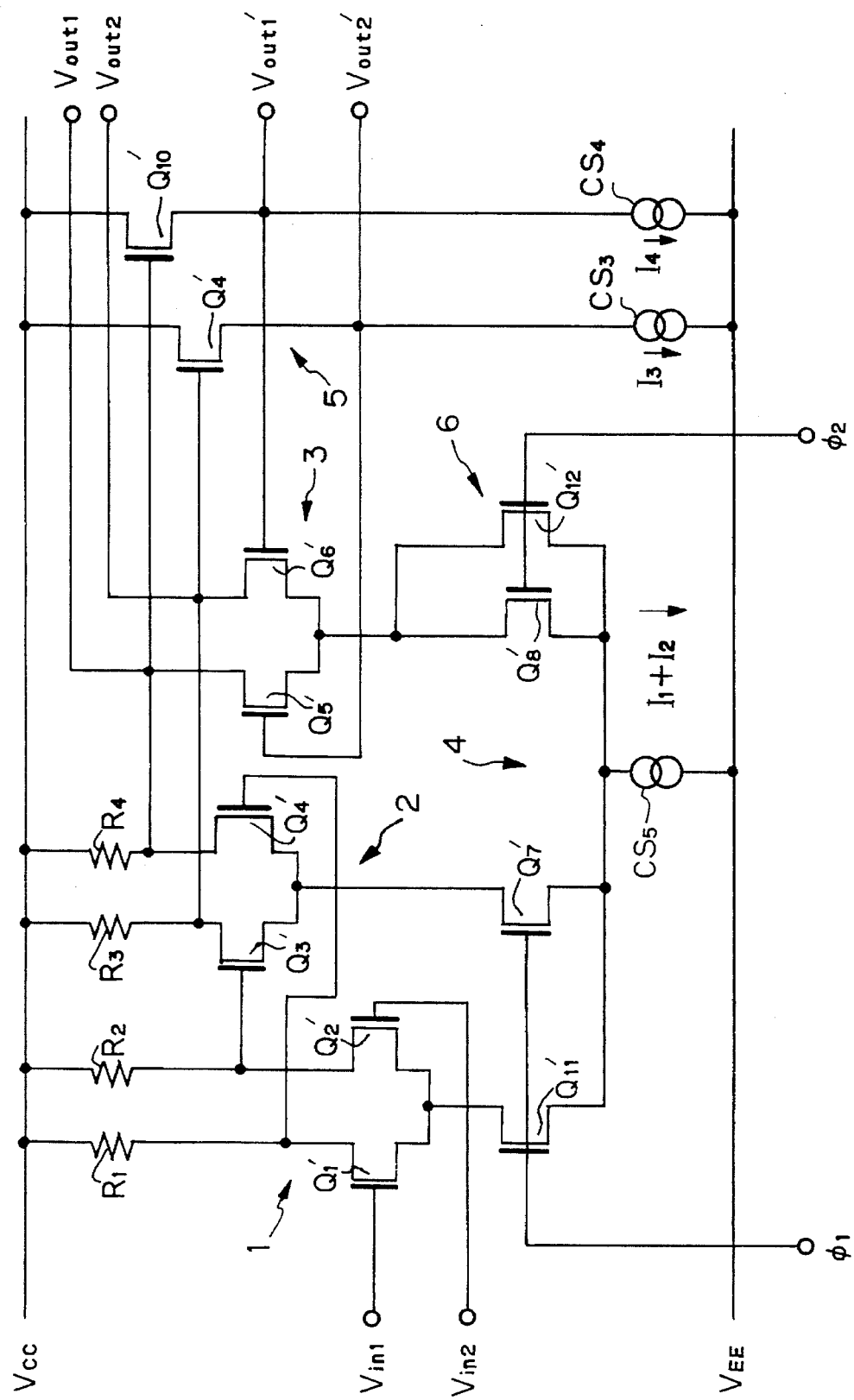
FIG. 16 is a circuit diagram Illustrating a modification of the comparator of FIG. 9.
Figure 17:
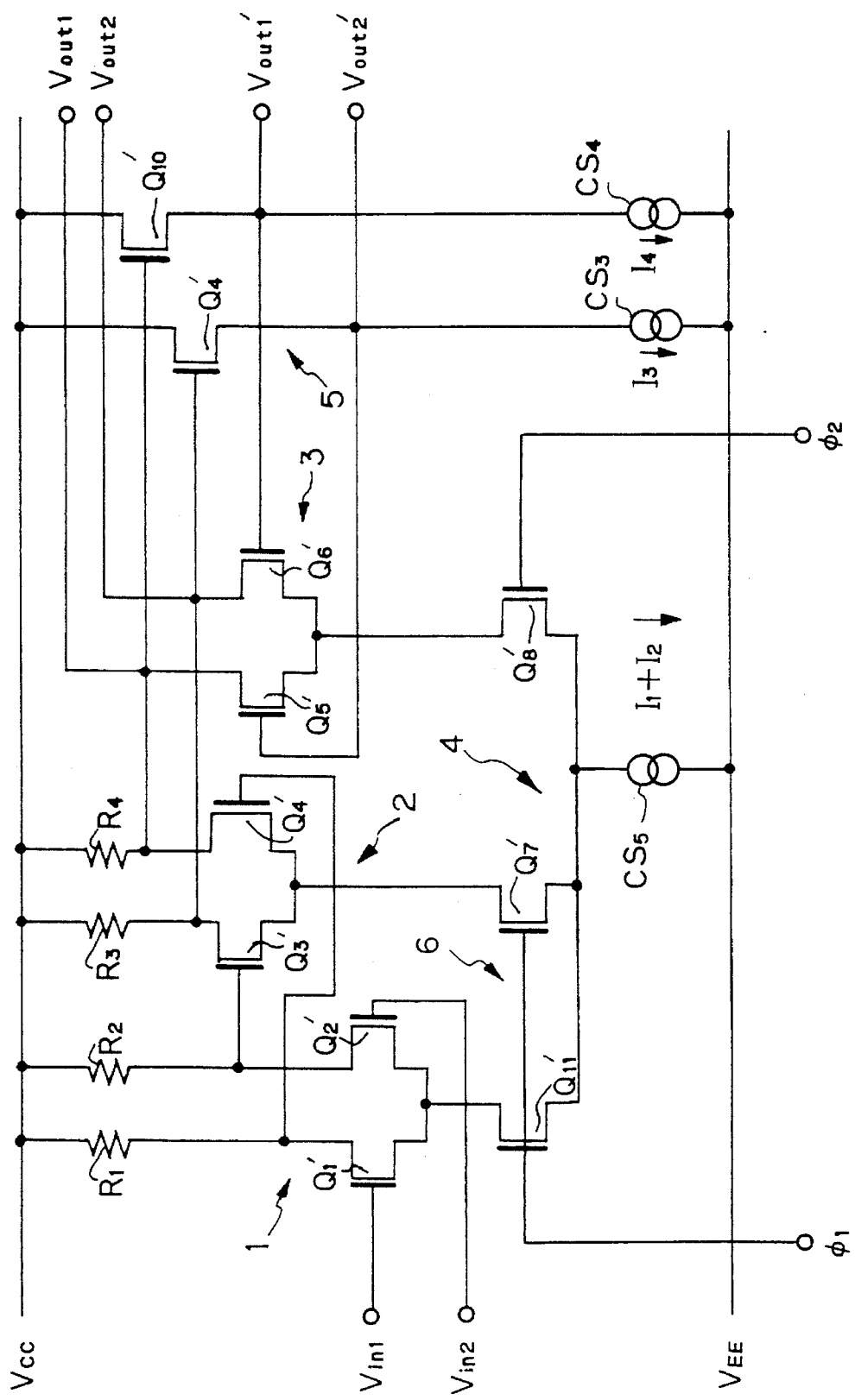
FIG. 17 is a circuit diagram illustrating a modification of the comparator of FIG. 10.

Although the transistors in the first to sixth embodiments are of an NPN type, the transistors can be of a PNP type. For example, the comparator of FIG. 4 can be modified into a comparator as illustrated in FIG. 11.

Further, although the transistors in the first to sixth embodiments are of a bipolar type, the transistors can be of a MOS type. That is, the comparators of FIG. 4, 6, 7, 8, 9 and 10 can be modified into comparators of FIGS. 12, 13, 14, 15, 16 and 17, respectively, where all transistors are of an N channel MOS type.

As explained hereinbefore, according to the present invention, since the operation speed of the latch stage can be increased, the operation speed of the comparator can be increased.

I claim:

1. A comparator comprising:

a first differential amplifier stage for receiving first and second input signals and amplifying the difference in potential therebetween to generate first and second differential signals;

a second differential amplifier stage, connected to said first differential amplifier stage, for receiving said first and second differential signals and amplifying the difference in potential therebetween to generate third and fourth differential signals;

a latch stage, connected to said second differential amplifier stage, for positively feeding said third and fourth differential signals back to said second differential amplifier to latch said third and fourth differential signals;

a first differential switch circuit, connected to said second differential stage and said latch stage, for alternately activating said second differential amplifier stage and said latch stage; and a second differential switch circuit, connected to said first differential stage and said latch stage, for alternately activating said first differential stage and said latch stage.

2. A comparator as set forth in claim 1, wherein said first differential switch circuit activates said second differential amplifier stage when said second differential switch circuit activates said first differential stage, said first differential switch circuit activating said latch stage when said second differential switch circuit activates said latch stage.

3. A comparator as set forth in claim 1, wherein said first differential amplifier stage comprises:

first and second resistors connected to a first power supply terminal;

a first transistor, connected between said first resistor and said second differential switch circuit and being controlled by said first input signal to generate said first differential signal; and a second transistor, connected between said second resistor and said second differential switch circuit and being controlled by said second input signal to generate said second differential signal.

4. A comparator as set forth in claim 1, wherein said second differential amplifier stage comprises:

third and fourth resistors connected to a first power supply terminal;

a third transistor, connected between said third resistor and said first differential switch circuit and being controlled by said second differential signal to generate said third differential signal; and a fourth transistor, connected between said fourth resistor and said first differential switch circuit and being controlled by said first differential signal to generate said fourth differential signal.

5. A comparator asset forth in claim 1, wherein said latch stage comprises:

fifth and sixth resistors connected to a first power supply terminal;

a fifth transistor, connected between said fifth resistor and said first and second differential switch circuits and being controlled by said fourth differential signal to control said third differential signal; and a sixth transistor, connected between said sixth resistor and said first and second differential switch circuits and being controlled by said third differential signal to control said fourth differential signal.

6. A comparator as set forth in claim 1, wherein said first differential switch circuit comprises:

a seventh transistor connected to said second differential amplifier stage and being controlled by a first control signal;

an eighth transistor connected to said latch stage and being controlled by a second control signal opposite in phase to said first control signal; and a first constant current source connected to said-seventh and eighth transistors and to a second power supply terminal.

7. A comparator as set forth in claim 1, wherein said second differential switch circuit comprises:

a ninth transistor connected to said first differential amplifier stage and being controlled by a first control signal;

a tenth transistor connected to said latch stage and being controlled by a second control signal opposite in phase to said first control signal; and a second constant current source connected to said ninth and tenth transistors and to a second power supply terminal.

8. A comparator as set forth in claim 1, wherein said first differential switch circuit comprises:

a seventh transistor connected to said second differential amplifier stage and being controlled by a first control signal; and an eighth transistor connected to said latch stage and being controlled by a second control signal opposite in phase to said first control signal, and wherein said second differential switch circuit comprises:

a ninth transistor connected to said first differential amplifier stage and being controlled by said first control signal; and a tenth transistor connected to said latch stage and being controlled by said second control signal, said comparator further comprising a constant current source connected to said seventh, eighth, ninth and tenth transistors and to said second power supply terminal.

9. A comparator as set forth in claim 8, wherein said eighth and tenth transistors are replaced by a single transistor.

10. A comparator as set forth in claim 1, further comprising a buffer circuit between said second differential amplifier stage and said latch stage.

11. A comparator comprising:

first and second power supply terminals;

first, second, third and fourth resistors connected to said first power supply terminal;

a first transistor having a collector connected to said first resistor, a base for receiving a first input signal, and an emitter;

a second transistor having a collector connected to said second resistor, a base for receiving a second input signal, and an emitter;

a third transistor having a collector connected to said third resistor, a base connected to said second resistor, and an emitter;

a fourth transistor having a collector connected to said fourth resistor, a base connected to said first resistor, and an emitter;

a fifth transistor having a collector connected to said third resistor, a base connected to said fourth resistor, and an emitter;

a sixth transistor having a connector connected to said fourth resistor, a base collected to said third resistor, and an emitter;

a seventh transistor having a collector connected to the emitters of said first and second transistors, a base for receiving a first control signal, and an emitter;

an eighth transistor having a collector connected to the emitters of said third and fourth transistors, a base for receiving said first control signal;

a ninth transistor having a collector connected to the emitters of said fifth and sixth transistors, a base for receiving a second control signal opposite in phase to said first control signal, and an emitter;

a tenth transistor having a collector connected to the emitters of said fifth and sixth transistors, a base for receiving said second control signal, and an emitter;

a first constant current source connected to the emitters of said seventh and tenth transistors and to said second power supply terminal; and a second constant current source connected to the emitters of said eighth and ninth transistors and to said second power supply terminal.

12. A comparator as set forth in claim 11, further comprising:

an eleventh transistor having a collector connected to said first power supply terminal, a base connected to said third resistor, and an emitter connected to the base of said fifth transistor, a twelfth transistor having a collector connected to said first power supply terminal, a base connected to said fourth resistor, and an emitter connected to the base of said sixth transistor;

a third constant current source connected between the emitter of said eleventh transistor and said second power supply terminal; and a fourth constant current source connected between the emitter of said twelfth transistor and said second power supply terminal.

13. A comparator comprising:

first and second power supply terminals;

first, second, third and fourth resistors connected to said first power supply terminal;

a first transistor having a collector connected to said first resistor, a base for receiving a first input signal, and an emitter;

a second transistor having a collector connected to said second resistor, a base for receiving a second input signal, and an emitter;

a third transistor having a collector connected to said third resistor, a base connected to said second resistor, and an emitter;

a fourth transistor having a collector connected to said fourth resistor, a base connected to said first resistor, and an emitter;

a fifth transistor having a collector connected to said third resistor, a base connected to said fourth resistor, and an emitter;

a sixth transistor having a collector connected to said fourth resistor, a base connected to said third resistor, and an emitter;

a seventh transistor having a collector connected to the emitters of said first and second transistors, a base for receiving a first control signal, and an emitter;

an eighth transistor having a collector connected to the emitters of said third and fourth transistors, a base for receiving said first control signal;

a ninth transistor having a collector connected to the emitters of said fifth and sixth transistors, a base for receiving a second control signal opposite in phase to said first control signal, and an emitter;

a tenth transistor having a collector connected to the emitters of said fifth and sixth transistors, a base for receiving said second control signal, and an emitter; and a constant current source connected to the emitters of said seventh, eighth, ninth and tenth transistors and to said second power supply terminal.

14. A comparator comprising:

first and second power supply terminals;

first, second, third and fourth resistors connected to said first power supply terminal;

a first transistor having a collector connected to said first resistor, a base for receiving a first input signal, and an emitter;

a second transistor having a collector connected to said second resistor, a base for receiving a second input signal, and an emitter;

a third transistor having a collector connected to said third resistor, a base connected to said second resistor, and an emitter;

a fourth transistor having a collector connected to said fourth resistor, a base connected to said first resistor, and an emitter;

a fifth transistor having a collector connected to said third resistor, a base connected to said fourth resistor, and an emitter;

a sixth transistor having a collector connected to said fourth resistor, a base connected to said third resistor, and an emitter;

a seventh transistor having a collector connected to the emitters of said first and second transistors, a base for receiving a first control signal, and an emitter;

an eighth transistor having a collector connected to the emitters of said third and fourth transistors, a base for receiving said first control signal;

a ninth transistor having a collector connected to the emitters of said fifth and sixth transistors, a base for receiving a second control signal opposite in phase to said first control signal, and an emitter; and a constant current source connected to the emitters of said seventh, eighth and ninth transistors and to said second power supply terminal.

15. A comparator comprising:

first and second power supply terminals;

first, second, third and fourth resistors connected to said first power supply terminal;

a first transistor having a drain connected to said first resistor, a gate for receiving a first input signal, and a source;

a second transistor having a drain connected to said second resistor, a gate for receiving a second input signal, and a source;

a third transistor having a drain connected to said third resistor, a gate connected to said second resistor, and a source;

a fourth transistor having a drain connected to said fourth resistor, a gate connected to said first resistor, and a source;

a fifth transistor having a drain connected to said third resistor, a gate connected to said fourth resistor, and a source;

a sixth transistor having a drain connected to said fourth resistor, a gate connected to said third resistor, and a source;

a seventh transistor having a drain connected to the sources of said first and second transistors, a gate for receiving a first control signal, and a source;

an eighth transistor having a drain connected to the sources of said third and fourth transistors, a gate for receiving said first control signal;

a ninth transistor having a drain connected to the sources of said fifth and sixth transistors, a gate for receiving a second control signal opposite in phase to said first control signal, and a source;

a tenth transistor having a drain connected to the sources of said fifth and sixth transistors, a gate for receiving said second control signal, and a source;

a first constant current source connected to the sources of said seventh and tenth transistors and to said second power supply terminal; and a second constant current source connected to the sources of said eighth and ninth transistors and to said second power supply terminal.

16. A comparator as set forth in claim 15, further comprising:

an eleventh transistor having a drain connected to said first power supply terminal, a gate connected to said third resistor and a source connected to the gate of said fifth transistor, a twelfth transistor having a drain connected to said first power supply terminal, a gate connected to said fourth resistor, and a source connected to the gate of said sixth transistor;

a third constant current source connected between the source of said eleventh transistor and said second power supply terminal; and a fourth constant current source connected between the source of said twelfth transistor and said second power supply terminal.

17. A comparator comprising:

first and second power supply terminals;

first, second, third and fourth resistors connected to said first power supply terminal;

a first transistor having a drain connected to said first resistor, a gate for receiving a first input signal, and a source;

a second transistor having a drain connected to said second resistor, a gate for receiving a second input signal, and a source, a third transistor having a drain connected to said third resistor, a gate connected to said second resistor, and a source;

a fourth transistor having a drain connected to said fourth resistor, a gate connected to said first resistor, and a source;

a fifth transistor having a drain connected to said third resistor, a gate connected to said fourth resistor, and a source;

a sixth transistor having a drain connected to said fourth resistor, a gate connected to said third resistor, and a source;

a seventh transistor having a drain connected to the sources of said first and second transistors, a gate for receiving a first control signal, and a source;

an eighth transistor having a drain connected to the emitters of said third and fourth transistors, a gate for receiving said first control signal;

a ninth transistor having a drain connected to the sources of said fifth and sixth transistors, a gate for receiving a second control signal opposite in phase to said first control signal, and a source;

a tenth transistor having a drain connected to the sources of said fifth and sixth transistors, a gate for receiving said second control signal, and a source; and a constant current source connected to the sources of said seventh, eighth, ninth and tenth transistors and to said second power supply terminal.

18. A comparator comprising:

first and second power supply terminals;

first, second, third and fourth resistors connected to said first power supply terminal;

a first transistor having a drain connected to said first resistor, a gate for receiving a first input signal, and a source;

a second transistor having a drain connected to said second resistor, a gate for receiving a second input signal, and a source, a third transistor having a drain connected to said third resistor, a gate connected to said second resistor, and a source;

a fourth transistor having a drain connected to said fourth resistor, a gate connected to said first resistor, and a source;

a fifth transistor having a drain connected to said third resistor, a gate connected to said fourth resistor, and a source;

a sixth transistor having a drain connected to said fourth resistor, a gate connected to said third resistor, and a source;

a seventh transistor having a drain connected to the sources of said first and second transistors, a gate for receiving a first control signal, and a source;

an eighth transistor having a drain connected to the sources of said third and fourth transistors, a gate for receiving said first control signal;

a ninth transistor having a drain connected to the sources of said fifth and sixth transistors, a gate for receiving a second control signal opposite in phase to said first control signal, and a source; and a constant current source connected to the sources of said seventh, eighth and ninth transistors and to said second power supply terminal.

* * * * *